US009530923B2

(12) United States Patent
Molesa et al.

(10) Patent No.: US 9,530,923 B2
(45) Date of Patent: Dec. 27, 2016

(54) ION IMPLANTATION OF DOPANTS FOR FORMING SPATIALLY LOCATED DIFFUSION REGIONS OF SOLAR CELLS

(71) Applicant: SunPower Corporation, San Jose, CA (US)

(72) Inventors: Steven E. Molesa, San Jose, CA (US); Timothy D. Dennis, Canton, TX (US); Sheng Sun, Foster City, CA (US); Richard Sewell, Los Altos, CA (US)

(73) Assignee: SunPower Corporation, San Jose, CA (US)

( * ) Notice: Subject to any disclaimer, the term of this patent is extended or adjusted under 35 U.S.C. 154(b) by 586 days.

(21) Appl. No.: 13/725,628

(22) Filed: Dec. 21, 2012

(65) Prior Publication Data
US 2014/0174515 A1  Jun. 26, 2014

(51) Int. Cl.
*H01L 31/18* (2006.01)
*H01L 31/0352* (2006.01)
*H01L 31/068* (2012.01)

(52) U.S. Cl.
CPC .......... *H01L 31/18* (2013.01); *H01L 31/0352* (2013.01); *H01L 31/0682* (2013.01); *H01L 31/1804* (2013.01); *Y02E 10/547* (2013.01); *Y02P 70/521* (2015.11)

(58) Field of Classification Search
CPC .. H01L 31/18; H01L 31/0352; H01L 31/0682; H01L 31/1804
USPC .................. 136/255; 438/185, 231, 232, 251
See application file for complete search history.

(56) References Cited

U.S. PATENT DOCUMENTS

| | | | |
|---|---|---|---|
| 5,194,397 A | * | 3/1993 | Cook ................ H01L 21/02238 148/DIG. 124 |
| 2008/0121278 A1 | * | 5/2008 | Ito et al. ........................ 136/256 |
| 2009/0020156 A1 | | 1/2009 | Ohtsuka et al. |
| 2011/0003424 A1 | | 1/2011 | De Ceuster et al. |
| 2011/0162703 A1 | * | 7/2011 | Adibi et al. ................... 136/256 |
| 2011/0201188 A1 | * | 8/2011 | Gupta ........................... 438/181 |
| 2012/0000522 A1 | * | 1/2012 | Dennis et al. ................. 136/256 |
| 2013/0291932 A1 | * | 11/2013 | Bateman et al. ............. 136/255 |

OTHER PUBLICATIONS

PCT International Search Report and Written Opinion of the International Searching Authority for Application No. PCT/US2013/046820, Nov. 21, 2013, 6 sheets.

* cited by examiner

*Primary Examiner* — Keith Hendricks
*Assistant Examiner* — Kourtney S Carlson
(74) *Attorney, Agent, or Firm* — Okamoto & Benedicto LLP

(57) ABSTRACT

Diffusion regions of a solar cell are formed using a blanket layer of film that is doped with dopants of a first conductivity type. Dopants of a second conductivity type are implanted in select regions of the blanket layer of film to form dopant source regions of the second conductivity type. Diffusion regions of the solar cell are formed by diffusing dopants of the first conductivity type and dopants of the second conductivity type from the blanket layer of film into an underlying silicon material. The blanket layer of film may be a P-type dopant source layer doped with boron, with phosphorus being implanted in select regions of the P-type dopant source layer to form N-type dopant source regions in the P-type dopant source layer.

13 Claims, 7 Drawing Sheets

ION IMPLANTATION OF DOPANTS FOR FORMING SPATIALLY LOCATED DIFFUSION REGIONS OF SOLAR CELLS

TECHNICAL FIELD

Embodiments of the subject matter described herein relate generally to solar cells. More particularly, embodiments of the subject matter relate to solar cell fabrication processes and structures.

BACKGROUND

Solar cells are well known devices for converting solar radiation to electrical energy. A solar cell has a front side that faces the sun during normal operation to collect solar radiation and a backside opposite the front side. Solar radiation impinging on the solar cell creates electrical charges that may be harnessed to power an external electrical circuit, such as a load.

Solar cell fabrication processes typically include numerous steps involving masking, etching, deposition, diffusion, and other steps. Embodiments of the present invention provide solar cell processes with reduced number of steps for reduced fabrication cost and higher throughput.

BRIEF SUMMARY

In one embodiment, diffusion regions of a solar cell are formed using a blanket layer of film that is doped with dopants of a first conductivity type. Dopants of a second conductivity type are implanted in select regions of the blanket layer of film to form dopant source regions of the second conductivity type. Diffusion regions of the solar cell are formed by diffusing dopants of the first conductivity type and dopants of the second conductivity type from the blanket layer of film into an underlying semiconductor material, such as silicon. The blanket layer of film may be a P-type dopant source layer doped with boron, with phosphorus being implanted in select regions of the P-type dopant source layer to form N-type dopant source regions in the P-type dopant source layer. The silicon material may comprise polycrystalline silicon or monocrystalline silicon substrate, for example.

These and other features of the present invention will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. The figures are not drawn to scale.

DETAILED DESCRIPTION

In the present disclosure, numerous specific details are provided, such as examples of apparatus, structures, materials, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

In an all backside contact solar cell, the P-type and N-type diffusion regions and all corresponding metal contacts are on the backside of the solar cell. The diffusion regions may be formed by diffusing dopants from dopant sources. To meet process requirements, the dopant sources typically need to be located within less than 100 μm from each other and aligned to the center or edge of the wafer to enable alignment of subsequent processing steps. The difficulty of aligning the dopant sources is confounded by positional accuracy requirements of other steps, such as separation of a P-type diffusion region and an N-type diffusion region by a trench.

One technique of spatially locating diffusion regions of a solar cell may involve depositing a blanket layer of the dopant source, applying a lithographic paste on top of the dopant source, patterning the paste using an etch process, and driving dopants from the dopant source into an underlying layer to form a diffusion region. This technique involving deposition, patterning, and etching not only requires many steps but is also costly to implement.

Another technique of spatially locating diffusion regions may involve substituting an ink containing dopant for the lithographic paste. This technique may include applying a dopant ink, e.g., using a screen printer or alternate type of printer, with the desired pattern on the top of the surface requiring the dopant source and driving dopants from the ink into the blanket layer of opposite type dopant in a thermal processing step. A problem with this technique is that it places several challenging functional requirements on the dopant ink. More particularly, the ink must be printable, must be capable of being a dopant source, and must not dope areas not covered by the ink as a result of outgassing. The ink itself thus becomes costly and depending on how the ink is used may not produce a net fabrication cost reduction.

FIGS. 1-4 are cross-sectional views schematically illustrating fabrication of a solar cell in accordance with an embodiment of the present invention. The solar cell being fabricated is an all backside contact solar cell because, as it will be more apparent below, its P-type and N-type diffusion regions and corresponding metal contacts are on the backside of the solar cell.

Figure 1:
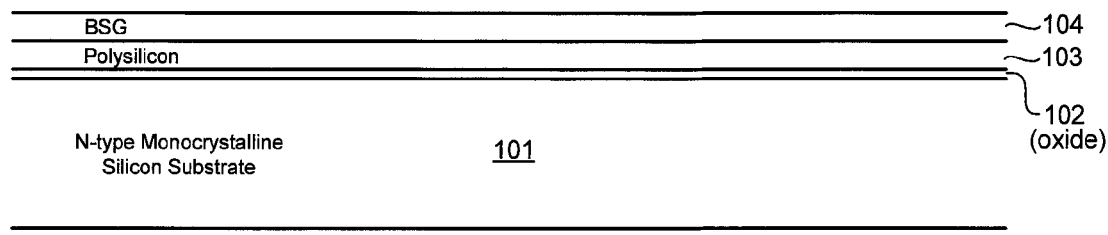
FIGS. 1-4 are cross-sectional views schematically illustrating fabrication of a solar cell in accordance with an embodiment of the present invention.

In FIG. 1, a thin dielectric layer in the form of a silicon dioxide 102 is formed on the backside surface of a main substrate, which in the example of FIG. 1 is an N-type monocrystalline silicon substrate 101. In one embodiment, the silicon dioxide 102 is thermally grown directly on the backside surface of the monocrystalline silicon substrate 101 to a thickness less than or equal to 40 Angstroms (e.g., between 5 to 40 Angstroms, preferably 20 Angstroms). The silicon dioxide 102 may provide a tunneling function, e.g., serve as a tunnel oxide.

A layer of polycrystalline (also referred to as "polysilicon") silicon 103 is formed on the silicon dioxide 102. A P-type dopant source layer 104 is thereafter formed on the polycrystalline silicon 103. As its name implies, the P-type dopant source layer 104 serves as a source of P-type dopants. In one embodiment, the P-type dopant source layer 104 comprises a blanket layer of borosilicate glass (BSG) formed by deposition, such as chemical vapor deposition or vapor phase epitaxy. More particularly, the dopant source layer 104 may be grown on the polycrystalline silicon 103 while introducing P-type dopants into the deposition chamber. Dopants (boron in this example) from the P-type dopant source layer 104 are subsequently diffused to the underlying polycrystalline silicon 103 to form P-type diffusion regions therein. In general, the P-type dopant source layer 104 (and other P-type dopant source layers introduced below) may comprise a boron-doped oxide.

The layer of polycrystalline silicon 103 and the P-type dopant source layer 104 may be formed by separate deposition steps. In other embodiments, such as in the subsequently described FIGS. 9-11, the layers may be grown in-situ (i.e., without vacuum break) in the same tool one after another by vapor phase epitaxy.

Figure 2:
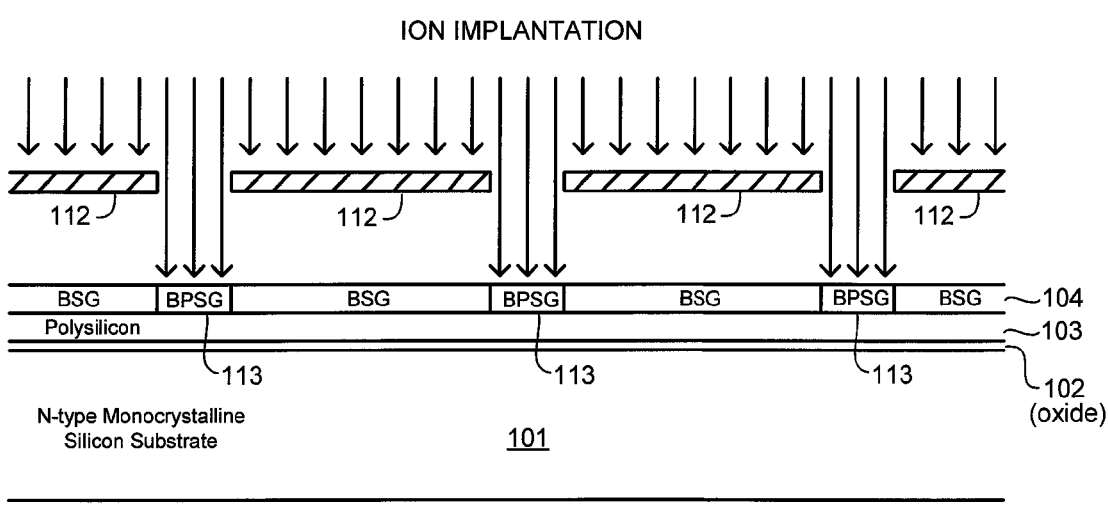

In FIG. 2, the solar cell structure of FIG. 1 is placed in an ion implantation tool, which is also referred to as an "ion implanter." The semiconductor industry has employed ion implantation for a number of years. However, in order to achieve spatial placement, a hard mask (e.g., photoresist, oxide, nitride) that defines the areas to be implanted typically needs to be formed on the surface of the wafer. The spatial accuracy required for diffusion placement in the manufacture of solar cells is several orders of magnitude less stringent than in semiconductor device fabrication, e.g., less than 200 μm for solar cell fabrication versus less than 10 nm for semiconductor device fabrication. Accordingly, an ion implantation tool that uses removable and disposable masks that reside in the tool, rather than formed on the surface of the wafer, may be used to implant dopants in solar cells.

Still, ion implantation presents unique challenges in the fabrication of an all backside contact solar cell because the P-type and N-type diffusion regions must be spatially located properly to each other and pattern aligned to the center or edge of the wafer. To achieve this spatial location using ion implantation would require separate implant steps, one for P-type dopants and another for N-type dopants, each with its separate implant mask. In the fabrication of high efficiency solar cells, this may require better than 10 μm accuracy pattern placement to ensure that the diffusion regions do not overlap one another and create large regions of space charge recombination, which is exceptionally challenging for a high throughput (e.g., greater than 2100 units per hour (UPH)) implant tool.

In the example of FIG. 2, the implant mask 112 is part of the ion implantation tool and not formed on the solar cell substrate. For example, the implant mask 112 may be a removable mask that may inserted in or out of the implant tool independent of the solar cell substrate. To address pattern placement accuracy concerns, only one dopant conductivity type is implanted with ion implantation. In the example of FIG. 2, only N-type dopants are implanted by ion implantation; the P-type dopants are formed with a blanket layer of film serving as a P-type dopant source layer. In one embodiment, phosphorus ions are selectively implanted in particular regions of the P-type dopant source layer 104 through the implant mask 112. Phosphorus is not implanted in regions of the P-type dopant source layer 104 that are covered by the implant mask 112, leaving these regions as P-type dopant sources.

The regions of the P-type dopant source layer 104 exposed by the mask 112 become N-type dopant source regions 113. In the example of FIG. 2, because the P-type dopant source layer 104 comprises BSG and phosphorus is implanted, the regions 113 of the layer 104 where phosphorus is implanted comprise borophosphosilicate glass (BPSG). That is, the ion implantation step forms N-type dopant source regions 113 in the P-type dopant source layer 104. The N-type dopant source regions 113 are so named because they provide N-type dopants (phosphorus in this example) that will be subsequently diffused into the layer of polysilicon 103 to form N-type diffusion regions.

In the BPSG of the regions 113, phosphorus is favorably diffused into an underlying silicon. This occurs because phosphorus diffusion in boron oxide films is enhanced and because the phosphorus slows the diffusion of boron into the silicon interface. Accordingly, with a suitable ratio of phosphorus concentration to boron concentration in the regions 113, the regions 113 effectively allows for diffusion of substantially mostly phosphorus (instead of boron), allowing the regions 113 to serve as N-type dopant sources. In one embodiment, the phosphorus is implanted into the BSG such that the peak of the implant occurs near the silicon surface, thereby minimizing the amount of boron that would diffuse into the silicon before the phosphorus diffused into the silicon. The energy of implant is selected based on the thickness of the BSG layer. A 6000 Å (Angstroms) thick BSG layer may require 200 KeV implant energy, which is relatively high energy. A lower energy implant is preferable, so a BSG thickness of around 2000 Å is preferred, to a minimum of 1000 Å. The preferred dose of phosphorus is such that phosphorus dose is between 4% to 10% of the total weight of the BPSG, such that sufficient phosphorus reaches the Silicon surface to retard the diffusion of boron.

The selective implantation of N-type dopants into the P-type dopant source layer 104 results in the formation of N-type dopant source regions 113 in the P-type dopant source layer 104, while keeping the rest of the P-type dopant source layer 104 as P-type dopant sources. As can be appreciated, this allows for two different polarity dopant sources to be formed without having to perform additional deposition, patterning, and etching steps, resulting in reduced solar cell fabrication steps. Implant mask placement accuracy concerns are addressed by implanting only one of the two types of dopants, which are the N-type dopants in this example, for forming the diffusion regions. That is, only one critical alignment step is needed to ensure that the resulting N-type diffusion regions are properly located. The other dopants are provided in a blanket film layer, which is the P-type dopant source layer 104 in this example, instead of being introduced by ion implantation.

Figure 3:
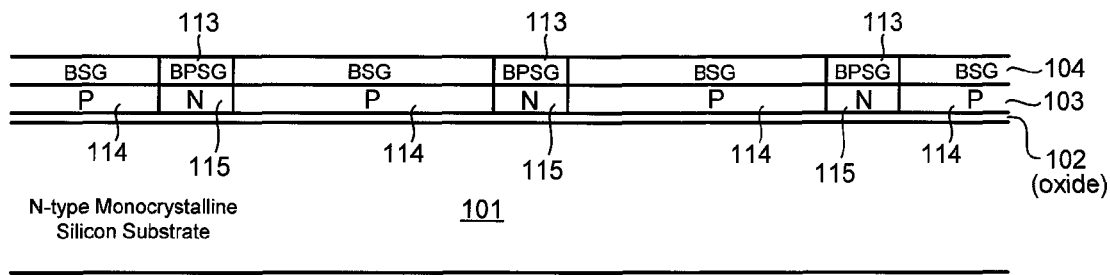

In FIG. 3, a diffusion step is performed to diffuse P-type dopants from the P-type dopant source layer 104 into the polycrystalline silicon 103 to form P-type diffusion regions 114. The P-type dopants that diffused to form the P-type diffusion regions 114 are from regions of the P-type dopant source layer 104 that have not been implanted with N-type dopants. The diffusion step also diffused N-type dopants from the N-type dopant source regions 113 into the polycrystalline silicon 103 to form N-type diffusion regions 115. The diffusion of P-type and N-type dopants to form corresponding P-type and N-type diffusion regions in the polycrystalline silicon 103 may occur in the same thermal processing step, which may be performed immediately after or at any step following the ion implantation step.

Figure 4:
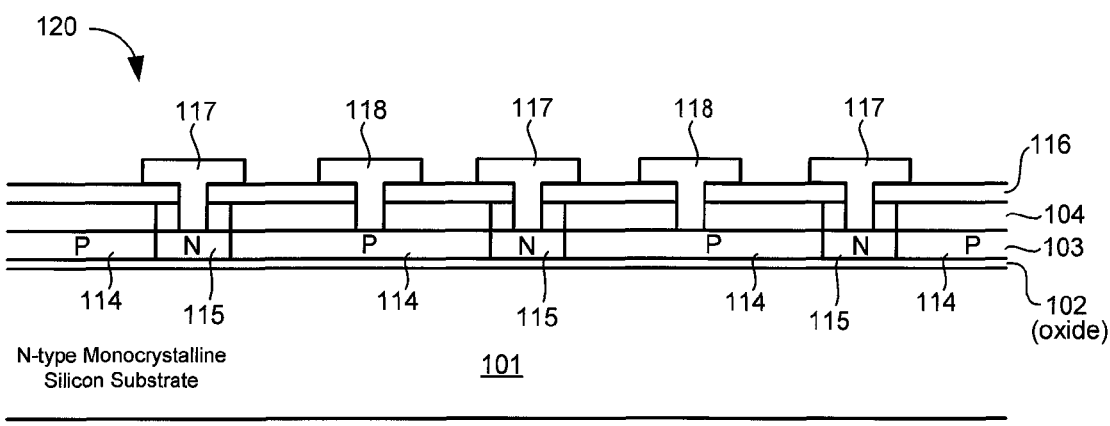

Additional steps may be performed to complete the fabrication of the solar cell. In FIG. 4, these additional steps include forming a dielectric layer 116, and other layers, for electrical insulation, passivation, and/or other purposes, on the backside of the solar cell. Metal contacts 117 and 118 are then formed in contact holes to electrically couple to corresponding N-type diffusion regions 115 and P-type diffusion regions 114, respectively. The metal contacts 117 and 118 may be interdigitated. The solar cell is an all backside contact solar cell, where the metal contacts 117, metal contacts 118, P-type diffusion regions 114, and N-type diffusion regions 115 are all on the backside (see arrow 120) of the solar cell. The front side of the solar cell (see arrow 121) is opposite the backside and faces the sun during normal operation.

In the example of FIGS. 1-4, the P-type diffusion regions 114 and N-type diffusion regions 115 are formed in the layer of polycrystalline silicon 103, which is external to the monocrystalline silicon substrate 101. In other embodiments, the P-type and N-type diffusion regions are formed within the monocrystalline silicon substrate instead of an external layer of material. A particular example is now explained with reference to FIGS. 5-8.

Figure 5:
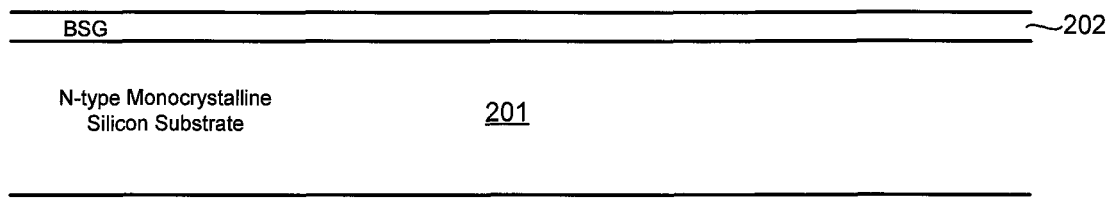
FIGS. 5-8 are cross-sectional views schematically illustrating fabrication of a solar cell in accordance with another embodiment of the present invention.

FIGS. 5-8 are cross-sectional views schematically illustrating fabrication of a solar cell in accordance with an embodiment of the present invention. In FIG. 5, a P-type dopant source layer 202 is formed on a backside of an N-type monocrystalline substrate 201. In one embodiment, the P-type dopant source layer comprises a blanket layer of BSG. As before, the P-type dopant source layer 202 serves as a source of P-type dopants, which comprise boron in this example.

Figure 6:
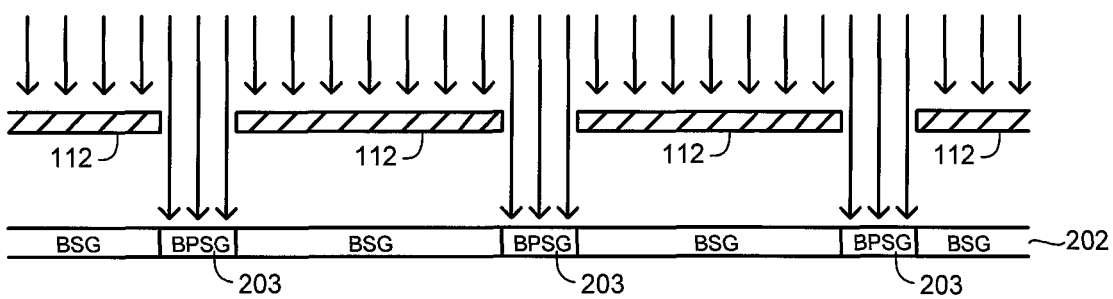

In FIG. 6, the solar cell structure of FIG. 5 is placed in an ion implantation tool with an implant mask 112. The implant mask 112 is part of the ion implantation tool and not formed on the solar cell substrate. In one embodiment, only N-type dopants are implanted by ion implantation. In particular, in one embodiment, phosphorus ions are selectively implanted in particular regions of the P-type dopant source layer 202 using the implant mask 112. Phosphorus is not implanted in regions of the P-type dopant source layer 202 that are covered by the implant mask 112, leaving these regions as P-type dopant sources.

The regions of the P-type dopant source layer 202 exposed by the implant mask 112 become N-type dopant source regions 203, which comprise BPSG in this example. The N-type dopant source regions 203 provide N-type dopants that will be subsequently diffused into the monocrystalline silicon substrate 201 to form N-type diffusion regions therein.

Figure 7:
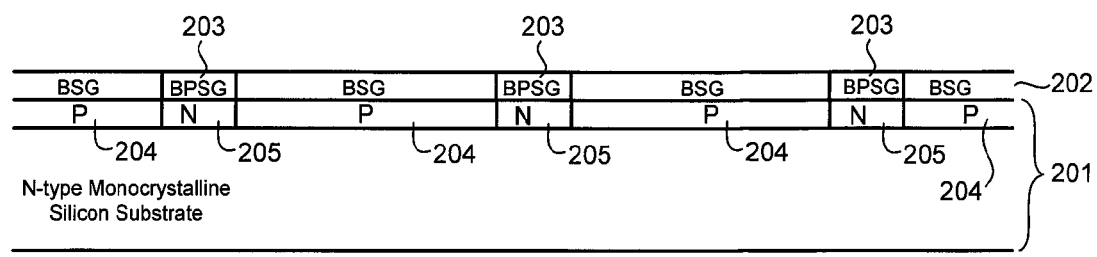

In FIG. 7, a diffusion step is performed to diffuse P-type dopants from the P-type dopant source layer 202 into the monocrystalline silicon substrate 201 to form P-type diffusion regions 204 in the monocrystalline silicon substrate 201. The P-type dopants that diffused to form the P-type diffusion regions 204 are from regions of the P-type dopant source layer 202 that have not been implanted with N-type dopants. The diffusion step also diffused N-type dopants from the N-type dopant source regions 203 into the monocrystalline silicon substrate 201 to form N-type diffusion regions 205 in the monocrystalline silicon substrate 201. The diffusion of P-type and N-type dopants to form corresponding P-type and N-type diffusion regions in the monocrystalline silicon substrate 201 may occur in the same thermal processing step, which may be performed immediately after or at any step following the ion implantation step.

Figure 8:
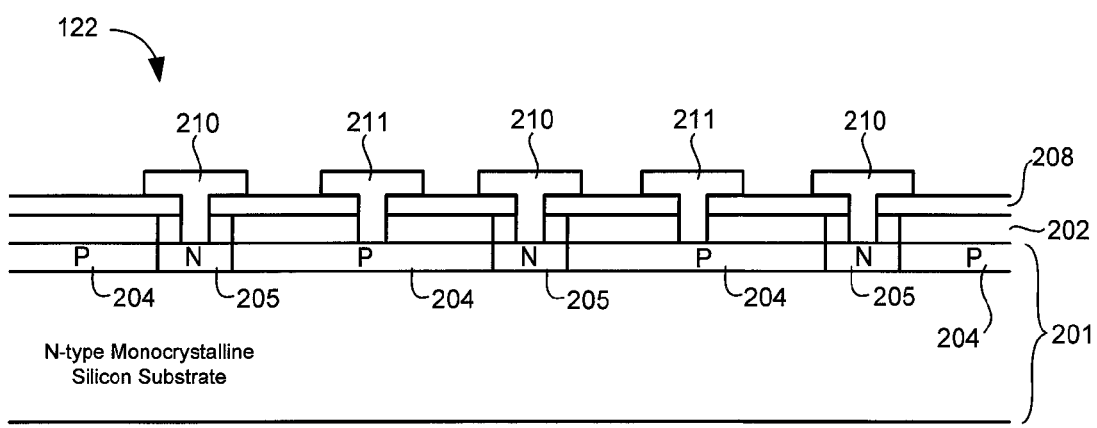

Additional steps may be performed to complete the fabrication of the solar cell. In FIG. 8, these additional steps include forming a dielectric layer 208, and other layers, for electrical insulation, passivation, and/or other purposes, on the backside of the solar cell. Metal contacts 210 and 211 are then formed in contact holes to electrically couple to corresponding N-type diffusion regions 205 and P-type diffusion regions 204, respectively. The metal contacts 210 and 211 may be interdigitated. The solar cell is an all backside contact solar cell, where the metal contacts 210, metal contacts 211, P-type diffusion regions 204, and N-type diffusion regions 205 are all on the backside (see arrow 122) of the solar cell. The front side of the solar cell (see arrow 123) is opposite the backside and faces the sun during normal operation.

The above described solar cell fabrication steps are performed on a solar cell structure comprising a doped monocrystalline silicon substrate and a P-type dopant source layer. In embodiments where the diffusion regions are external to the monocrystalline silicon substrate, a layer of polycrystalline silicon may be formed between the P-type dopant source layer and the monocrystalline silicon substrate as in FIG. 1. In embodiments where the diffusion regions are formed within the main silicon substrate, the layer of polycrystalline silicon may be omitted as in FIG. 5.

Figure 9:
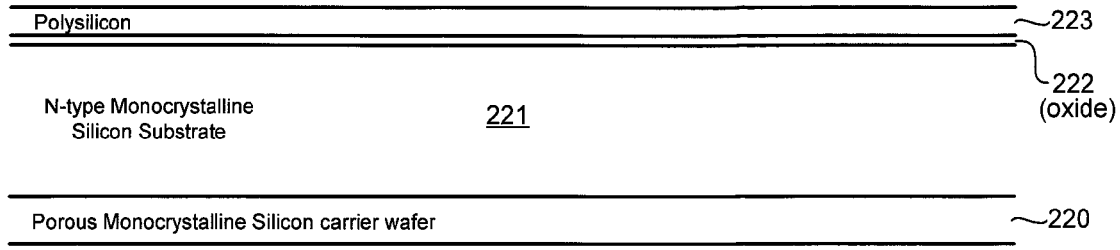
FIGS. 9-11 are cross-sectional views schematically illustrating formation of a polycrystalline silicon and monocrystalline silicon substrate stack in accordance with an embodiment of the present invention.
Figure 10:
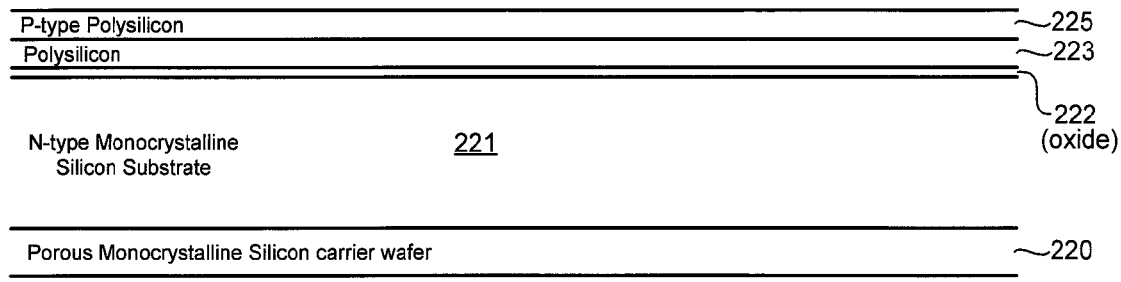
Figure 11:
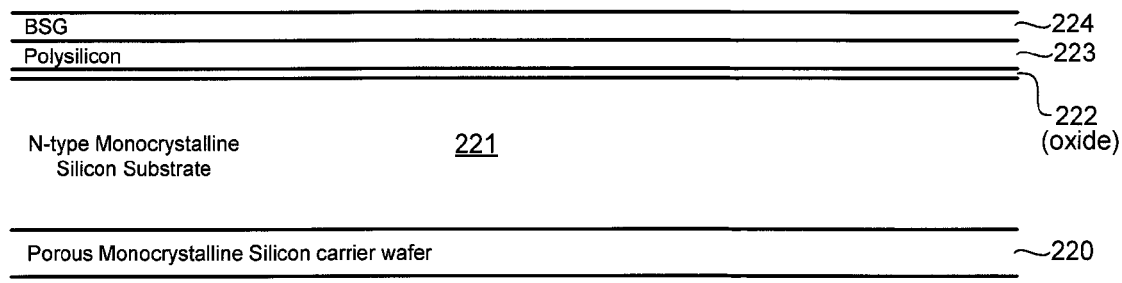

FIGS. 9-11 are cross-sectional views schematically illustrating formation of a polycrystalline silicon and monocrystalline silicon substrate stack in accordance with an embodiment of the present invention. In the example of FIGS. 9-11, the layers are grown one after another in situ without a vacuum break in the same chamber of the same tool, which in this example comprises an epitaxial reactor.

In FIG. 9, a main substrate in the form of an N-type monocrystalline silicon substrate 221 is grown from a porous monocrystalline silicon carrier wafer 220 by vapor phase epitaxy. An N-type dopant, such as phosphorus, is flowed into the chamber to dope the substrate 221 as N-type. Thereafter, oxygen is flowed into the chamber to grow a thin oxide layer 222 on the backside surface of N-type monocrystalline silicon substrate 221. A layer of polycrystalline silicon 223 is then grown on the surface of the oxide layer 222.

In FIG. 10, a layer of polycrystalline silicon is grown on the polycrystalline silicon 223 while flowing a P-type dopant, such as boron, in the chamber. The resulting layer is a P-type polycrystalline silicon 225, which is on the polycrystalline silicon 223.

In FIG. 11, the P-type polycrystalline silicon 225 is oxidized by flowing oxygen into the chamber, thereby transforming the P-type polycrystalline silicon 225 into a boron-doped oxide (e.g., BSG) that may be employed as a P-type dopant source layer 224. The resulting material stack may be processed to form N-type dopant source regions in the P-type dopant source layer 224 by ion implantation as before.

Figure 12:
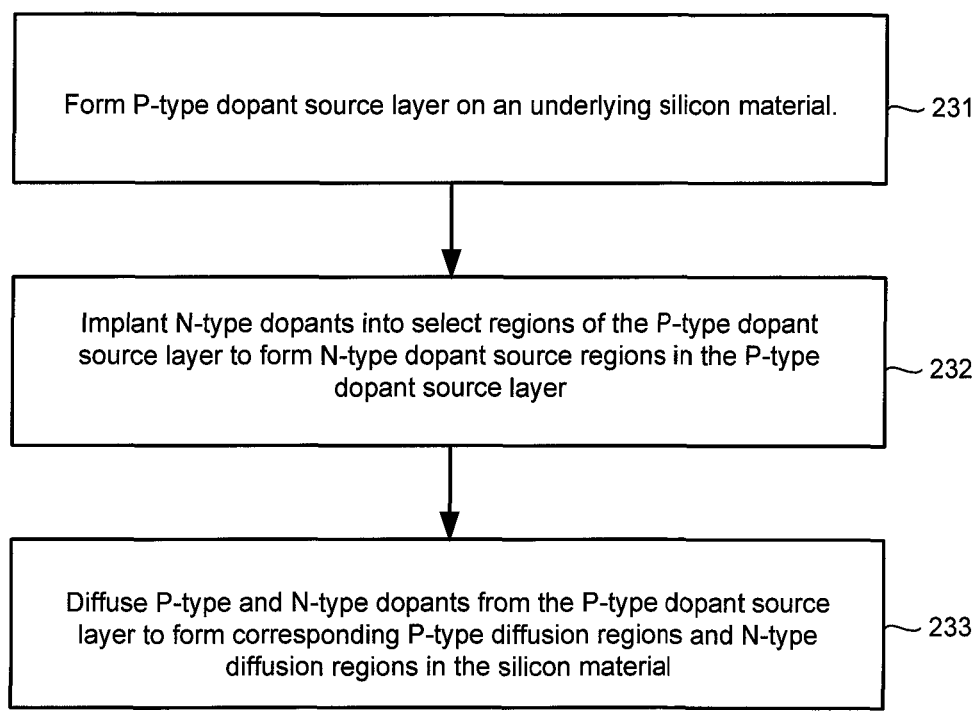
FIG. 12 shows a flow diagram of a method of forming diffusion regions of a solar cell in accordance with an embodiment of the present invention.

FIG. 12 shows a flow diagram of a method of forming diffusion regions of a solar cell in accordance with an embodiment of the present invention. In the example of FIG. 12, a blanket layer of film comprising dopants of a first conductivity type is formed over a silicon material (step 231). In one embodiment, the blanket layer of film is a P-type dopant source layer comprising a boron-doped oxide, such as BSG, formed over the silicon material. The silicon material may be polycrystalline silicon in embodiments where the diffusion regions of the solar cell are formed external to the main solar cell substrate. The silicon material may be an N-type monocrystalline silicon substrate in embodiments where the diffusion regions of the solar cell are formed within the N-type monocrystalline silicon substrate, which serves as the main solar cell substrate.

Ions of dopants of a second conductivity type (N-type in this example) opposite to the first conductivity type (P-type in this example) are then implanted into the blanket layer of film. In the example of FIG. 12, N-type dopants, such as boron, are implanted by ion implantation into select regions of the P-type dopant source layer to form N-type dopant source regions in the P-type dopant source layer (step 232). The ion implantation step results in the P-type dopant source layer having P-type dopant source regions in regions that have not been implanted with N-type dopants, and N-type dopant source regions in regions that have been implanted with N-type dopants. The implantation step may be performed using an implant mask that exposes the areas of the N-type dopant source regions and covers the areas of the P-type dopant source regions of the P-type dopant source layer.

A diffusion step is performed to diffuse P-type and N-type dopants from the P-type dopant source layer to form corresponding P-type diffusion regions and N-type diffusion regions in the silicon material (step 233). The silicon material may be a layer of polycrystalline silicon or a monocrystalline silicon substrate depending on the embodiment. The diffusion step diffuses P-type dopants from P-type dopant source regions of the P-type dopant source layer into the silicon material to form P-type diffusion regions in the silicon material. The same diffusion step also diffuses N-type dopants from N-type dopant source regions of the P-type dopant source layer into the silicon material to form N-type diffusion regions in the silicon material. In this embodiment, the solar cell being fabricated is an all backside contact solar cell where the P-type diffusion regions and the N-type diffusion regions are formed on the backside of the solar cell. The resulting solar cell has P-type diffusion regions directly under the P-type dopant source regions (e.g., BSG regions) of the P-type dopant source layer and N-type diffusion regions directly under the N-type dopant source regions (e.g., BPSG regions) of the P-type dopant source layer.

Figure 13:
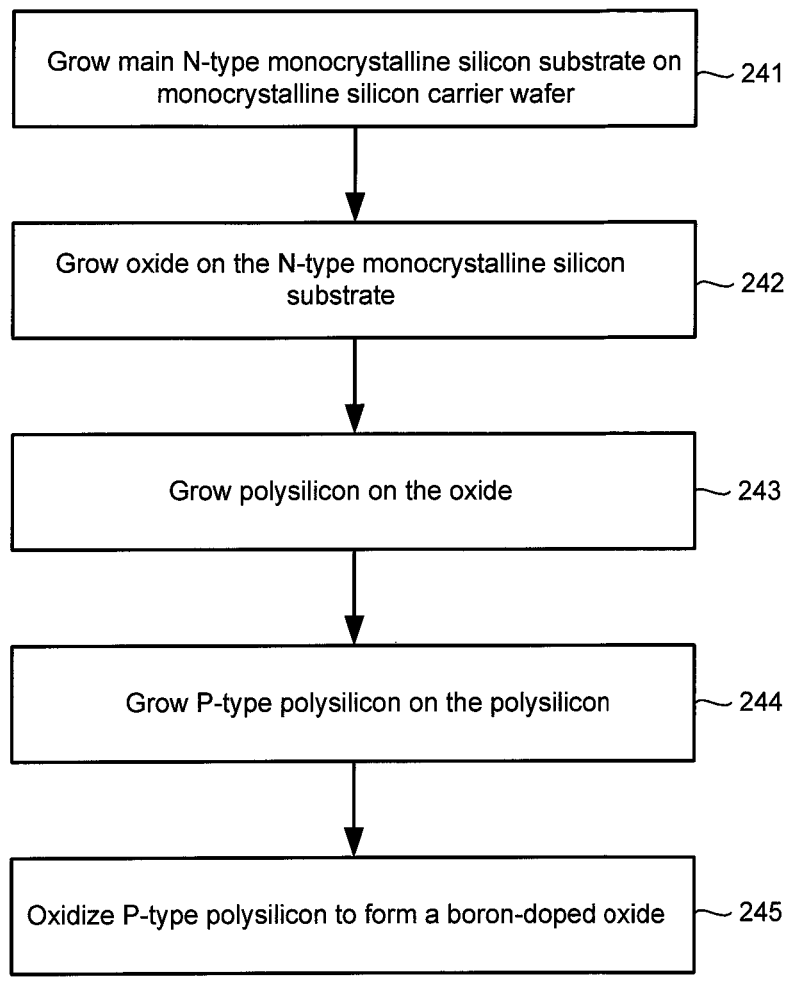
FIG. 13 shows a flow diagram of a method of forming a polycrystalline silicon and monocrystalline silicon substrate stack in accordance with an embodiment of the present invention.

FIG. 13 shows a flow diagram of a method of forming a polycrystalline silicon and monocrystalline silicon substrate stack in accordance with an embodiment of the present invention. The steps of the method of FIG. 13 may be performed in situ in the same chamber of the same tool, which in one embodiment is an epitaxial reactor.

In the example of FIG. 13, a main N-type monocrystalline silicon substrate is grown on a porous monocrystalline silicon carrier wafer (step 241). An N-type dopant, such as phosphorus, is flown into the chamber to dope the monocrystalline silicon substrate as N-type. Thereafter, oxygen is flown into the chamber to grow a thin oxide layer on the backside surface of the N-type monocrystalline silicon substrate (step 242). A first layer of polycrystalline silicon is then grown on the surface of the oxide layer (step 243). A second layer of polycrystalline silicon is grown on the first layer of polycrystalline silicon while flowing a P-type dopant, such as boron, in the chamber. The resulting second layer of polycrystalline silicon is a P-type polycrystalline silicon, which is on the first layer of polycrystalline silicon (step 244). The P-type polycrystalline silicon is thereafter oxidized by flowing oxygen into the chamber, thereby transforming the P-type polycrystalline silicon into a boron-doped oxide (step 245). The resulting material stack may be processed to form N-type dopant source regions in the boron-doped oxide by ion implantation as previously described.

Techniques for forming diffusion regions of solar cells and related structures have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of forming diffusion regions of a solar cell, the method comprising:
   forming a blanket layer of film comprising dopants of a first conductivity type over an entire exposed top surface of a silicon material;
   implanting ions of dopants of a second conductivity type, which is opposite to the first conductivity type, in discrete regions of the blanket layer of film that are exposed through a mask located above the blanket layer to form dopant source regions of dopants of the second conductivity type in the blanket layer of film;
   subsequently, diffusing dopants of the first conductivity type from the blanket layer of film into the silicon material to form diffusion regions of the first conductivity type of the solar cell in the silicon material and diffusing dopants of the second conductivity type from the blanket layer of film into the silicon material to form diffusion regions of the second conductivity type of the solar cell in the silicon material.

2. The method of claim 1 wherein the first conductivity type comprises P-type and the second conductivity type comprises N-type.

3. The method of claim 2 wherein the dopant source region of dopants of the second conductivity type in the blanket layer of film comprises borophosphosilicate glass (BPSG).

4. The method of claim 1 wherein the silicon material comprises polycrystalline silicon.

5. The method of claim 1 wherein the silicon material comprises monocrystalline silicon substrate.

6. A method of forming diffusion regions of a solar cell, the method comprising:
   forming a blanket dopant source layer comprising P-type dopants over an entire top surface of a silicon material;
   implanting by ion implantation N-type dopants into discrete regions of the blanket dopant source layer that are exposed through a mask located above the blanket dopant source layer;
   subsequently, forming N-type diffusion regions of the solar cell in the silicon material by diffusing N-type dopants from the discrete regions of the blanket dopant source layer into the silicon material and forming P-type diffusion regions of the solar cell in the silicon material by diffusing P-type dopants from other regions of the blanket dopant source layer into the silicon material, the other regions of the blanket dopant source layer comprising regions of the blanket dopant source layer not implanted with N-type dopants.

7. The method of claim 6, wherein the other regions of the blanket dopant source layer comprise boron and the select regions of the blanket dopant source layer comprise boron and phosphorus.

8. The method of claim 6, wherein the N-type dopants implanted into the select regions of the blanket dopant source layer comprise phosphorus.

9. The method of claim 6, wherein the silicon material comprises polycrystalline silicon.

10. The method of claim 6, wherein the silicon material comprises an N-type monocrystalline silicon substrate.

11. The method of claim 6, wherein the other regions of the blanket dopant source layer comprise borosilicate glass (BSG).

12. The method of claim 6, wherein the select regions of the blanket dopant source layer comprises borophosphosilicate glass (BPSG).

13. The method of claim 6, wherein the silicon material comprises polycrystalline silicon, and the method further comprises:
   forming a thin oxide on an N-type monocrystalline silicon substrate; and
   forming the polycrystalline silicon on the thin oxide, wherein the blanket dopant source layer is formed on the polycrystalline silicon.

* * * * *